(12) United States Patent
Oh

(10) Patent No.: US 11,176,989 B2
(45) Date of Patent: Nov. 16, 2021

(54) SEMICONDUCTOR MEMORY DEVICE HAVING PAGE BUFFER HIGH-VOLTAGE CIRCUIT

(71) Applicant: SK hynix Inc., Icheon-si (KR)

(72) Inventor: Sung Lae Oh, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 0 days.

(21) Appl. No.: 16/935,338

(22) Filed: Jul. 22, 2020

(65) Prior Publication Data
US 2021/0249068 A1   Aug. 12, 2021

(30) Foreign Application Priority Data
Feb. 12, 2020 (KR) .......................... 10-2020-0016723

(51) Int. Cl.
*G11C 11/4094* (2006.01)
*G11C 5/06* (2006.01)
*G11C 11/4097* (2006.01)
*G11C 11/4074* (2006.01)
*G11C 11/4093* (2006.01)

(52) U.S. Cl.
CPC ............ *G11C 11/4094* (2013.01); *G11C 5/06* (2013.01); *G11C 5/063* (2013.01); *G11C 11/4074* (2013.01); *G11C 11/4093* (2013.01); *G11C 11/4097* (2013.01)

(58) Field of Classification Search
CPC ............ G11C 11/4094; G11C 11/4074; G11C 11/4093; G11C 11/4097; G11C 5/06; G11C 5/063

USPC ................................ 365/185.13, 63, 189.05
See application file for complete search history.

(56) References Cited

U.S. PATENT DOCUMENTS

| | | | | |
|---|---|---|---|---|
| 8,339,849 | B2 * | 12/2012 | Kwak | H01L 27/0203 |
| | | | | 365/185.05 |
| 9,047,953 | B2 * | 6/2015 | Chen | G11C 16/0483 |
| 10,062,765 | B2 * | 8/2018 | Oh | H01L 27/1157 |
| 10,726,924 | B2 * | 7/2020 | Kim | H01L 27/11573 |
| 2007/0206399 | A1 * | 9/2007 | Makino | G11C 16/0483 |
| | | | | 365/63 |

FOREIGN PATENT DOCUMENTS

KR   10-2017-0018245 A   2/2017
KR   10-2021-0091457 A   7/2021

\* cited by examiner

*Primary Examiner* — Son L Mai

(57) ABSTRACT

A semiconductor memory device includes a plurality of bit lines extending in a first direction, and arranged in a second direction intersecting with the first direction, a page buffer high-voltage circuit divided into a plurality of page buffer high-voltage regions arranged in the first direction, each of the plurality of page buffer high-voltage regions including a plurality of page buffer high-voltage elements, each page buffer high-voltage element coupled to one of the plurality of bit lines, and a contact pad unit including a plurality of contact pads, each contact pad coupled to one of the plurality of page buffer high-voltage elements. The contact pad unit is arranged, in the first direction, between two of the plurality of page buffer high-voltage regions.

20 Claims, 18 Drawing Sheets

SEMICONDUCTOR MEMORY DEVICE HAVING PAGE BUFFER HIGH-VOLTAGE CIRCUIT

CROSS-REFERENCE TO RELATED APPLICATION

The present application claims priority under 35 U.S.C. § 119(a) to Korean Patent Application No. 10-2020-0016723 filed in the Korean Intellectual Property Office on Feb. 12, 2020, which is incorporated herein by reference in its entirety.

BACKGROUND

1. Technical Field

Various embodiments generally relate to semiconductor technology, and more particularly, to a semiconductor memory device.

2. Related Art

As the demand for portable phones, mobile memory devices and digital cameras increases, the demand for non-volatile memory devices, which are mainly used as memory devices for these products, also increases. Among nonvolatile memory devices, a NAND flash memory device is widely used as a data storage device. The NAND flash memory device includes a plurality of page buffers, which are coupled to bit lines, and performs an operation necessary for reading and outputting data stored in memory cells by using the page buffers.

Recently, as a measure for achieving a larger capacity and higher performance of a semiconductor memory device, a structure has been proposed in which components included in the semiconductor memory device are fabricated not on a single chip, but on a plurality of chips, and then chips are bonded to couple the components.

SUMMARY

Various embodiments are directed to a semiconductor memory device capable of contributing to improvements in yield and reliability.

In an embodiment, a semiconductor memory device comprises a plurality of bit lines extending in a first direction and arranged in a second direction intersecting with the first direction; a page buffer high-voltage circuit divided into a plurality of page buffer high-voltage regions arranged in the first direction, each of the plurality of page buffer high-voltage regions including a plurality of page buffer high-voltage elements, and each page buffer high-voltage element coupled to one of the plurality of bit lines; and a contact pad unit including a plurality of contact pads, each contact pad coupled to one of the plurality of page buffer high-voltage elements, wherein the contact pad unit may be arranged, in the first direction, between two of the plurality of page buffer high-voltage regions.

In another embodiment, a semiconductor memory device comprises a plurality of bit lines; a contact pad unit including a plurality of contact pads; and a page buffer high-voltage circuit including a plurality of page buffer high-voltage elements that may be coupled between the plurality of bit lines and a plurality of the contact pads, wherein the plurality of contact pads may be arranged in a direction intersecting with an arrangement direction of the plurality of bit lines, and a width of one of the plurality of contact pads may be larger than a pitch of the plurality of bit lines in the arrangement direction of the bit lines, and wherein the contact pad unit and the plurality of bit lines may be disposed in a bit line layer.

Another aspect of the disclosure provides a semiconductor memory device. In an embodiment, a semiconductor memory device comprises a circuit chip and at least one memory chip that may be stacked on the circuit chip, the memory chip comprising a memory cell array; a plurality of bonding pads defined on one surface; a plurality of bit lines disposed in a bit line layer between the memory cell array and the plurality of bonding pads; a contact pad unit including a plurality of contact pads disposed in the bit line layer, and coupled to the plurality of bonding pads through a plurality of contacts, respectively; and a page buffer high-voltage circuit divided into a plurality of page buffer high-voltage regions each including a plurality of page buffer high-voltage elements that may be coupled between the plurality of bit lines and the plurality of contact pads, wherein at least two of the plurality of page buffer high-voltage regions may be disposed on both sides, respectively, of the contact pad unit in an extending direction of the bit lines.

DETAILED DESCRIPTION

Figure 1:
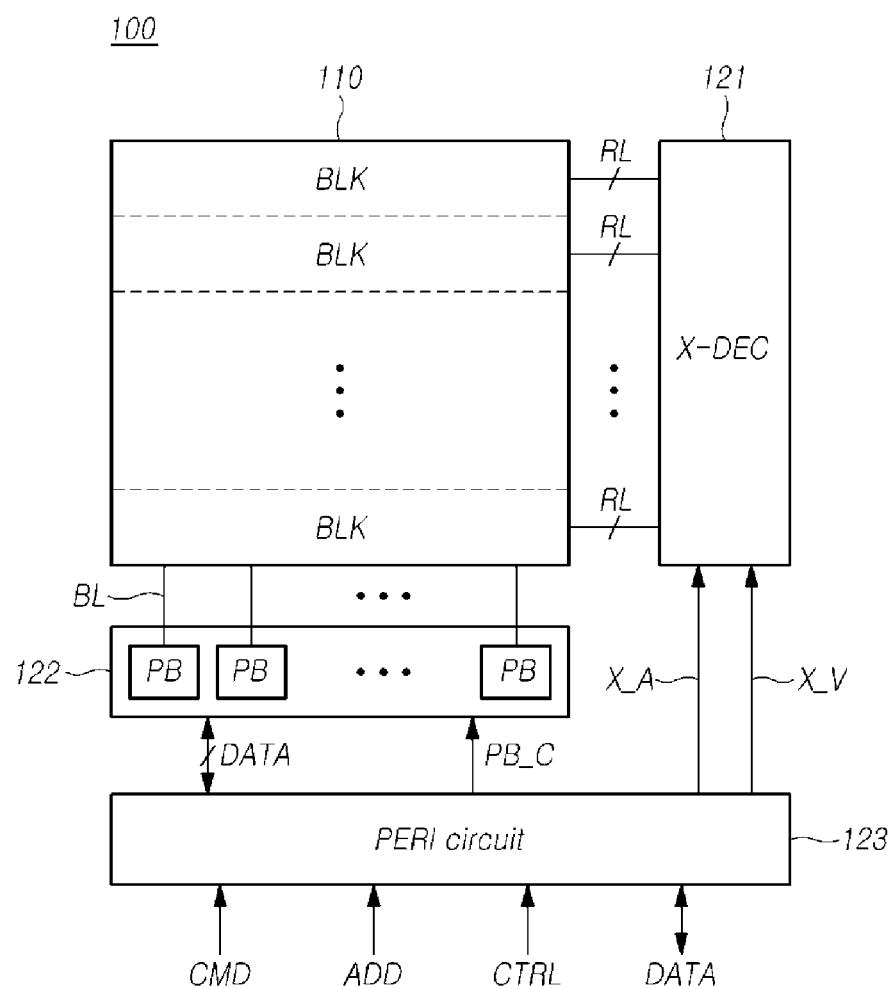
FIG. 1 is a block diagram illustrating a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram illustrating a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or a nonvolatile memory cell. While it will be described below that a semiconductor memory device 100 is a vertical NAND flash device, it is to be understood that the technical spirit of the disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL, based on the data signal DATA received from the peripheral circuit 123, in response to the page buffer control signal PB_C, and thereby, may write data in a memory cell of the memory cell array 110. The page buffer circuit 122 may write data in or read data from memory cells that are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Figure 2:
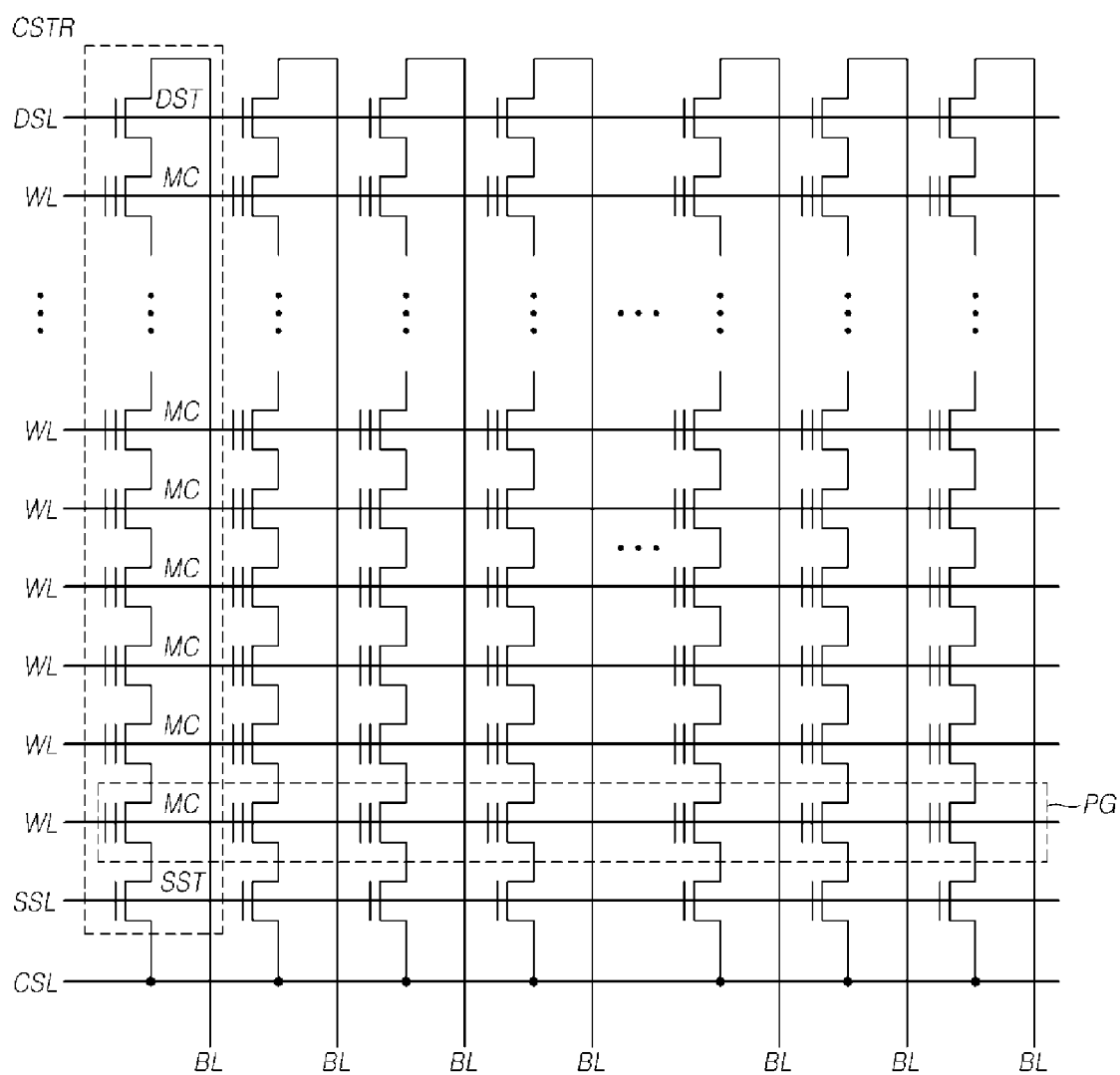
FIG. 2 is an equivalent circuit diagram illustrating a memory block illustrated in FIG. 1.

FIG. 2 is an equivalent circuit diagram illustrating a memory block illustrated in FIG. 1.

Referring to FIG. 2, a memory block BLK may include a plurality of cell strings CSTR, which are coupled between a plurality of bit lines BL and a common source line CSL. Each of the cell strings CSTR may be coupled between a corresponding bit line BL and the common source line CSL. Each of the cell strings CSTR may include a source select transistor SST, which is coupled to the common source line CSL, a drain select transistor DST, which is coupled to the bit line BL, and a plurality of memory cells MC, which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed in a direction perpendicular to the bit is lines BL. The source select line SSL, the word lines WL and the drain select line DSL may form a three-dimensional structure by being stacked in a vertical direction, perpendicular to a surface of a substrate.

The memory cells MC included in the memory block BLK may be divided into physical page units or logical page units. For example, memory cells MC which share one word line WL and are coupled to different cell strings CSTR may configure one physical page PG. Such a page may be used as the basic unit of a read operation.

FIG. 2 illustrates an example in which one drain select transistor DST and one source select transistor SST are provided in each of the cell strings CSTR. However, it is to be noted that in other instances, at least two drain select transistors or/and at least two source select transistors may be included in each of the cell strings CSTR.

Figure 3:
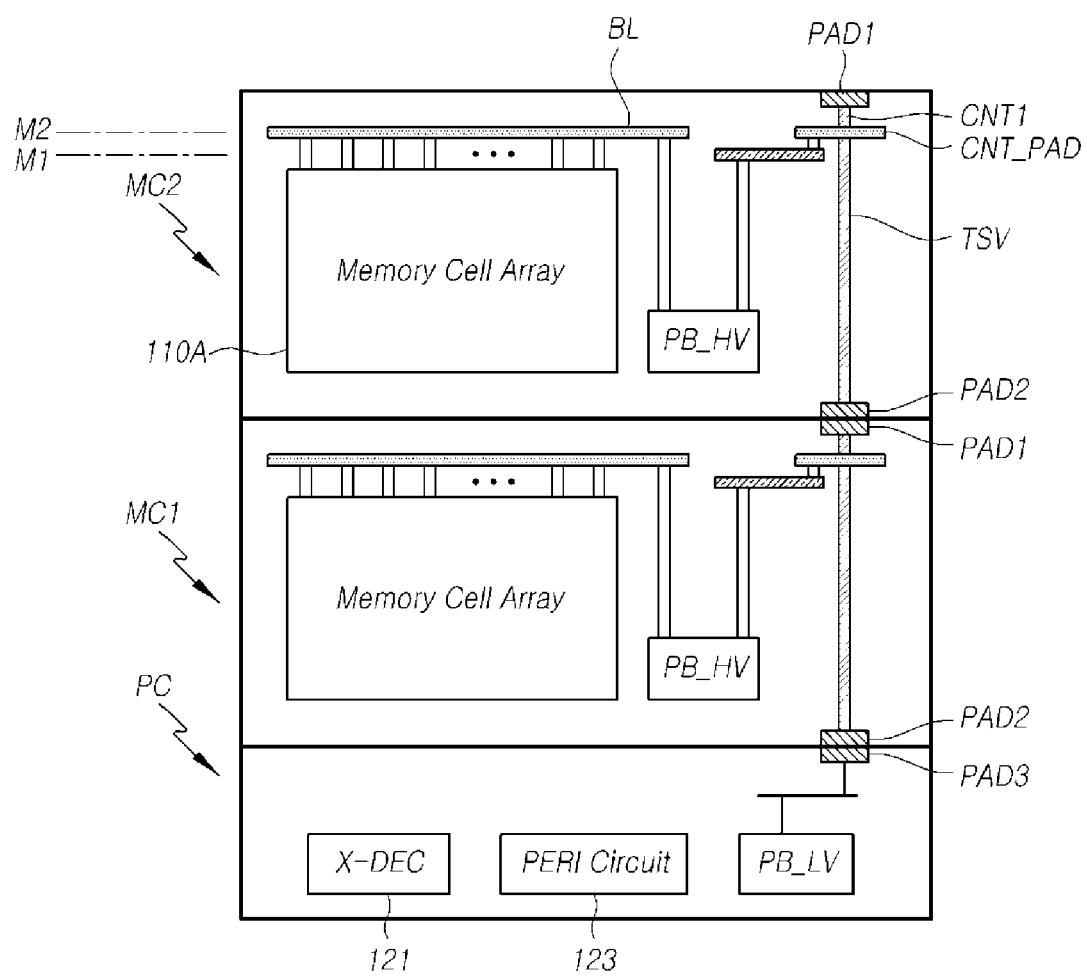
FIG. 3 is a cross-sectional view illustrating a semiconductor memory device in accordance with an embodiment of the disclosure.

FIG. 3 is a cross-sectional view illustrating a semiconductor memory device in accordance with an embodiment of the disclosure.

Referring to FIG. 3, a semiconductor memory device in accordance with an embodiment of the present disclosure includes a circuit chip PC, a first memory chip MC1 which is stacked or disposed on the circuit chip PC, and a second memory chip MC2 which is stacked on the first memory chip MC1. While FIG. 3 illustrates an example in which two memory chips are stacked on the circuit chip PC, any number of memory chips may be stacked on the circuit chip PC, such as one, or three or more.

Each of the first and second memory chips MC1 and MC2 may include a memory cell array 110A, a bit line BL which is coupled to the memory cell array 110A, and a page buffer high-voltage element PB_HV which is coupled to the bit line BL. The memory cell array 110A of the first memory chip MC1 and the memory cell array 110A of the second memory chip MC2 may constitute the memory cell array 110 of FIG. 1. In each of the first and second memory chips MC1 and MC2, the bit line BL may be defined in a wiring layer (hereinafter, referred to as a 'bit line layer') M2 over the respective memory cell array 110A and the page buffer high-voltage element PB_HV.

Each of the first and second memory chips MC1 and MC2 may have one surface and another surface which is opposite to or faces away from the one surface. A first bonding pad PAD1 may be defined on the one surface of each of the first and second memory chips MC1 and MC2, and a second bonding pad PAD2 may be defined on the other surface of each of the first and second memory chips MC1 and MC2. The bit line layer M2 may be disposed between the memory cell array 110A and the one surface. A contact pad CNT_PAD, which is electrically coupled to the page buffer high-voltage element PB_HV, may be defined in the bit line layer M2. The contact pad CNT_PAD may be coupled to the first bonding pad PAD1 through a contact CNT1. The contact pad CNT_PAD may serve as a pad for landing the contact CNT1. The first bonding pad PAD1 may be coupled to the second bonding pad PAD2 through the contact CNT1, the contact pad CNT_PAD and a through via TSV.

The circuit chip PC may include a row decoder 121, a peripheral circuit 123 and a page buffer low-voltage element PB_LV. The circuit chip PC may include a third bonding pad PAD3 on one surface, which faces the first memory chip MC1. The page buffer low-voltage element PB_LV may be coupled to the third bonding pad PAD3. The first memory chip MC1 may be stacked on the one surface of the circuit chip PC such that the second bonding pad PAD2 is coupled to the third bonding pad PAD3 of the circuit chip PC. The second memory chip MC2 may be stacked on the one surface of the first memory chip MC1 such that the second bonding pad PAD2 of the second memory chip MC2 is coupled to the first bonding pad PAD1 of the first memory chip MC1. The page buffer low-voltage element PB_LV of the circuit chip PC may be electrically coupled to the page buffer high-voltage elements PB_HV of the first and second memory chips MC1 and MC2. One page buffer may include one of the page buffer low-voltage elements PB_LV and one of the page buffer high-voltage elements PB_HV which are coupled to each other.

While FIG. 3 illustrates only one bit line BL in each of the first and second memory chips MC1 and MC2, it is to be understood that a plurality of bit lines are defined in each of the first and second memory chips MC1 and MC2. While FIG. 3 illustrates only one page buffer high-voltage element PB_HV and only one contact pad CNT_PAD in each of the first and second memory chips MC1 and MC2, it is to be understood that each of the first and second memory chips MC1 and MC2 may have a plurality of page buffer high-voltage elements, and that the number of page buffer high-voltage elements in a memory chip is the same as the number of bit lines and the number of contact pads in the memory chip.

While FIG. 3 illustrates only one page buffer low-voltage element PB_LV in the circuit chip PC, it is to be understood that a plurality of page buffer low-voltage elements may be defined in the circuit chip PC. While FIG. 3 illustrates an example in which the page buffer high-voltage element PB_HV of the first memory chip MC1 and the page buffer high-voltage element PB_HV of the second memory chip MC2 are coupled in common to the one page buffer low-voltage element PB_LV, it is to be noted that the page buffer high-voltage element PB_HV of the first memory chip MC1 and the page buffer high-voltage element PB_HV of the second memory chip MC2 may each be independently coupled to different page buffer low-voltage elements PB_LV.

Figure 4:
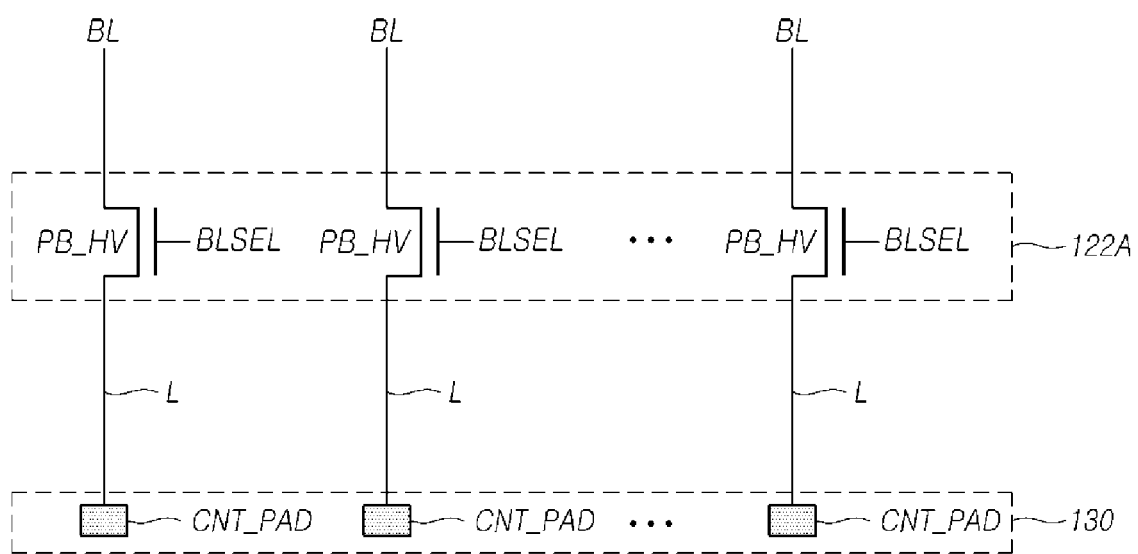
FIG. 4 is a circuit diagram illustrating a page buffer high-voltage circuit and a contact pad unit in accordance with an embodiment of the disclosure.

FIG. 4 is a circuit diagram illustrating a page buffer high-voltage circuit and a contact pad unit in accordance with an embodiment of the disclosure.

Referring to FIG. 4, a page buffer high-voltage circuit 122A may include a plurality of page buffer high-voltage elements PB_HV, which are coupled to a plurality of bit lines BL, respectively. For example, each page buffer high-voltage element PB_HV may include a bit line select transistor that is coupled between the bit line BL and a coupling line L, and may operate in response to a bit line select signal BLSEL. A contact pad unit 130 may include a plurality of contact pads CNT_PAD that are coupled to the plurality of page buffer high-voltage elements PB_HV through coupling lines L, respectively.

Referring to FIGS. 3 and 4, due to demands for the high integration and miniaturization of semiconductor memory devices, the number of bit lines BL is increasing, and the width of each bit line BL and the spacing between adjacent bit lines BL are decreasing. Accordingly, the number of contact pads CNT_PAD is increasing, and the size of each contact pad CNT_PAD is decreasing. If the size of the contact pad CNT_PAD decreases, then an overlay margin between the contact pad CNT_PAD and the contact CNT1 formed over it decreases, and thus, a coupling failure between the contact pad CNT_PAD and the contact CNT1 may occur. Embodiments of the present disclosure may propose ways of improving the overlay margin between the contact pad CNT_PAD and the contact CNT1.

Figure 5:
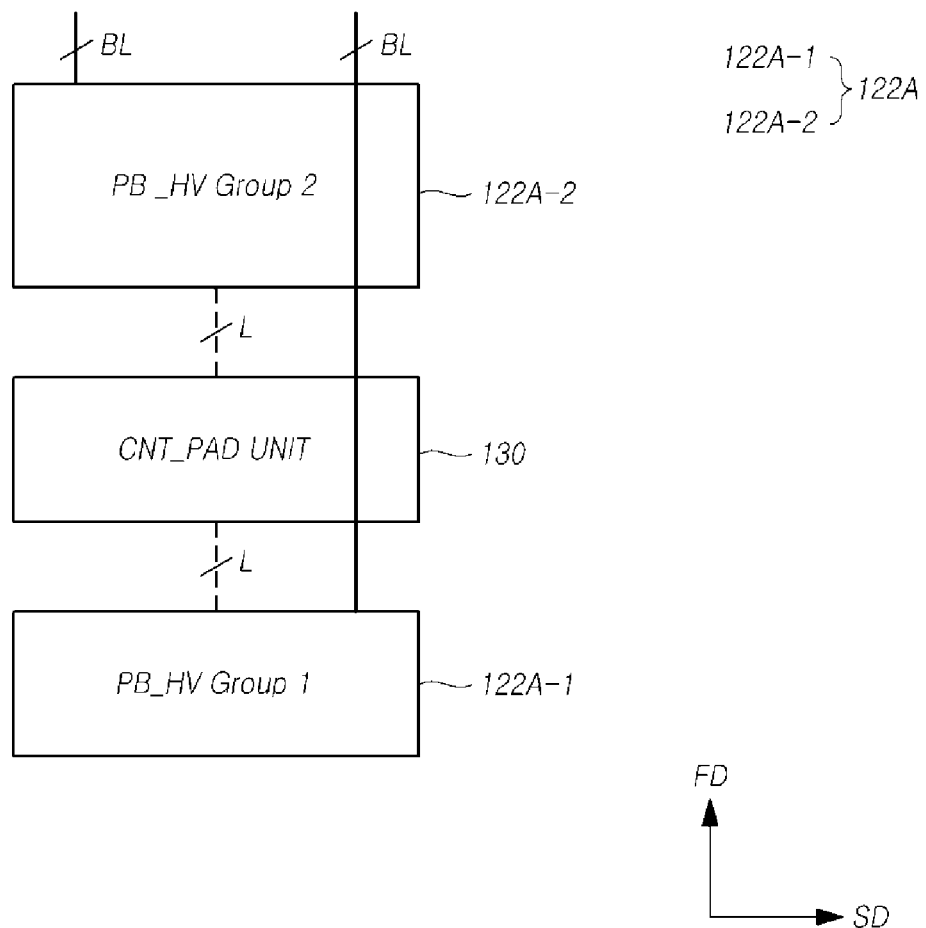
FIG. 5 is a block diagram illustrating a layout of a page buffer high-voltage circuit and a contact pad unit in accordance with an embodiment of the disclosure.

FIG. 5 is a block diagram illustrating a layout of a page buffer high-voltage circuit and a contact pad unit in accordance with an embodiment of the disclosure.

Referring to FIG. 5, when viewed from the top, in a plan view along the vertical direction, a page buffer high-voltage circuit 122A may be divided into a first page buffer high-voltage element group (PB_HV Group 1) 122A-1 and a second page buffer high-voltage element group (PB_HV Group 2) 122A-2, which are disposed on both sides, respectively, of a contact pad unit 130. The first page buffer high-voltage element group 122A-1 and the second page buffer high-voltage element group 122A-2 are spatially divided from each other, and so in this example the page buffer high-voltage circuit 122A may be defined as being divided into two separate page buffer high-voltage regions.

Each of the first page buffer high-voltage element group 122A-1 and the second page buffer high-voltage element group 122A-2 may be coupled to a plurality of bit lines BL, and thereby, may obtain information on a state of a memory cell array through the bit lines BL. Each of the first page buffer high-voltage element group 122A-1 and the second page buffer high-voltage element group 122A-2 may be coupled respectively to the contact pad unit 130 through a plurality of coupling lines L.

Figure 6:
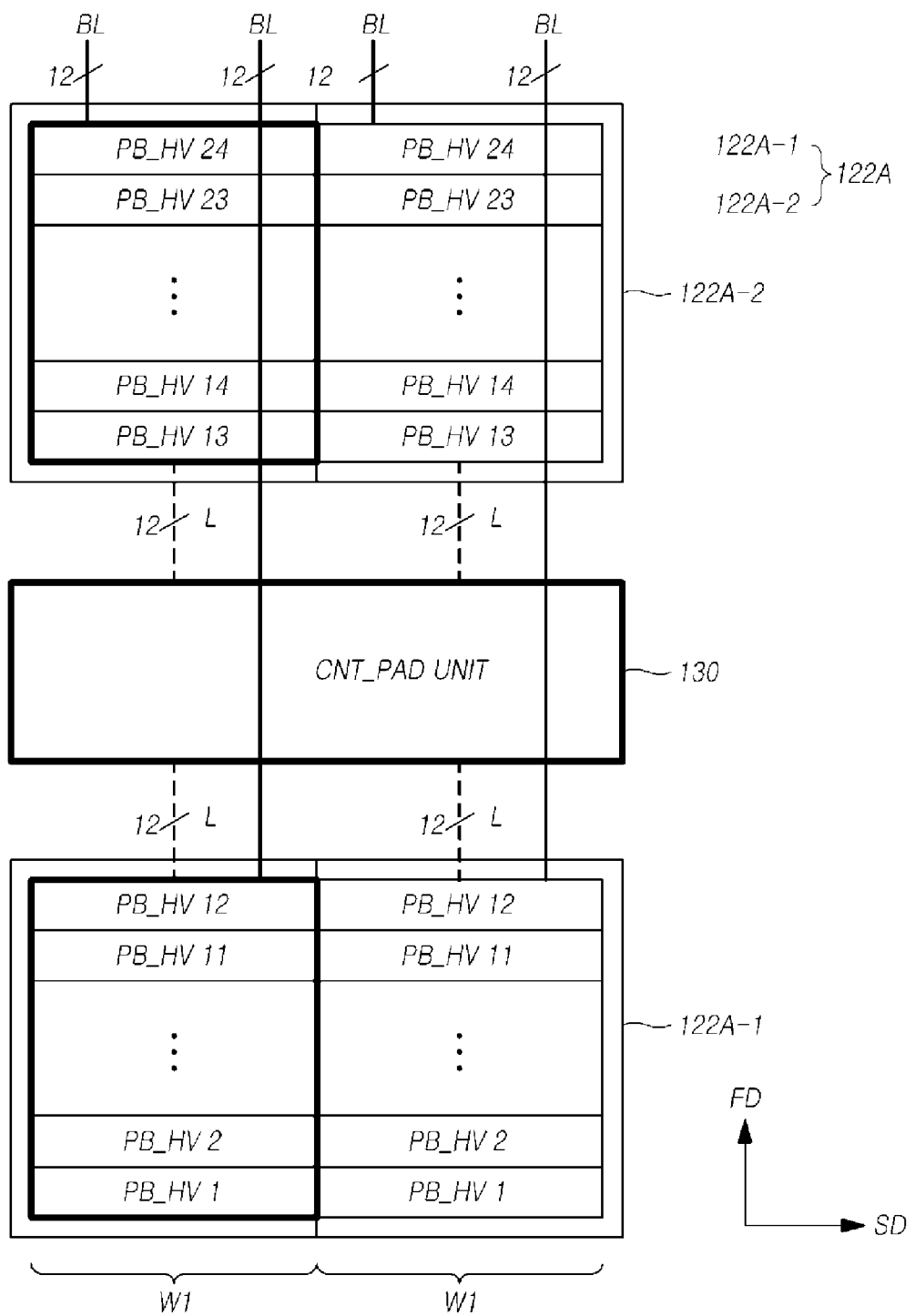
FIG. 6 is a diagram illustrating an internal layout of first and second page buffer high-voltage element groups of FIG. 5.

FIG. 6 is a diagram illustrating an internal layout of first and second page buffer high-voltage element groups of FIG. 5.

Referring to FIG. 6, each of the first page buffer high-voltage element group 122A-1 and the second page buffer high-voltage element group 122A-2 may include a plurality of page buffer high-voltage elements PB_HV, which are arranged in the form of a matrix in a first direction FD (column direction) and a second direction SD (row direction).

A plurality of bit lines BL may be provided in each column of the page buffer high-voltage circuit 122A. The bit lines BL may extend in the first direction FD, and may be arranged in the second direction SD. For example, twenty-four (24) bit lines BL may be disposed within a width W1 of a page buffer high-voltage element PB_HV (hereinafter, referred to as a 'page buffer high-voltage element width'), and may be arranged in the second direction SD. For example, the page buffer high-voltage element width W1 may correspond to 24 times the pitch of the bit line BL. In addition, in each column of page buffer high-voltage elements PB_HV, 24 page buffer high-voltage elements PB_HV may be arranged in the first direction FD. The page buffer high-voltage circuit 122A may be constituted by 24 rows of page buffer high-voltage elements PB_HV. That is to say, the number of page buffer high-voltage elements PB_HV that are disposed in one column may be the same as the number of bit lines BL that are disposed within the page buffer high-voltage element width W1 of the same column.

Therefore, if the page buffer high-voltage element width W1 is changed, then the number of page buffer high-voltage elements PB_HV that are disposed in one column may also be changed. However, embodiments of the disclosure are not limited to the above description, and in other embodiments the number of page buffer high-voltage elements PB_HV that are disposed in one column may be different from the number of bit lines BL that are disposed within the page buffer high-voltage element width W1.

The number of rows of page buffer high-voltage elements PB_HV in each of the first page buffer high-voltage element group 122A-1 and the second page buffer high-voltage element group 122A-2 may be half of the total number of rows of the page buffer high-voltage circuit 122A. For example, if the number of rows of page buffer high-voltage elements PB_HV in the page buffer high-voltage circuit 122A is 24, then the number of rows of each of the first page buffer high-voltage element group 122A-1 and the second page buffer high-voltage element group 122A-2 may be twelve (12).

The page buffer high-voltage elements PB_HV of the first page buffer high-voltage element group 122A-1 may be coupled in one-to-one correspondence to contact pads in the contact pad unit 130. To this end, coupling lines L, whose number is the same as the number of rows of the first page buffer high-voltage element group 122A-1, may be provided in each column of page buffer high-voltage elements PB_HV in the first page buffer high-voltage element group 122A-1, and thereby, may be used to couple the page buffer high-voltage elements PB_HV and the contact pads. For example, if the number of rows of page buffer high-voltage elements PB_HV of the first page buffer high-voltage element group 122A-1 is 12, then 12 coupling lines L may be provided within the page buffer high-voltage element width W1 on one side of the contact pad unit 130 common to the first page buffer high-voltage element group 122A-1.

The page buffer high-voltage elements PB_HV of the second page buffer high-voltage element group 122A-2 may be coupled in one-to-one correspondence to contact pads in the contact pad unit 130. To this end, coupling lines L, whose number is the same as the number of rows of the second page buffer high-voltage element group 122A-2, may be provided in each column of page buffer high-voltage elements PB_HV in the second page buffer high-voltage element group 122A-2, and thereby, may be used to couple the page buffer high-voltage elements PB_HV and the contact pads. For example, if the number of rows of page buffer high-voltage elements PB_HV of the second page buffer high-voltage element group 122A-2 is 12, then 12 coupling lines L may be provided within the page buffer high-voltage element width W1 on the other side of the contact pad unit 130 common to the second page buffer high-voltage element group 122A-2.

Although FIG. 6 illustrates a page buffer high-voltage circuit 122A with two columns for the sake of convenience in explanation, the page buffer high-voltage circuit 122A may include a larger number of columns in conformity with the size of the memory cell array.

Figure 7:
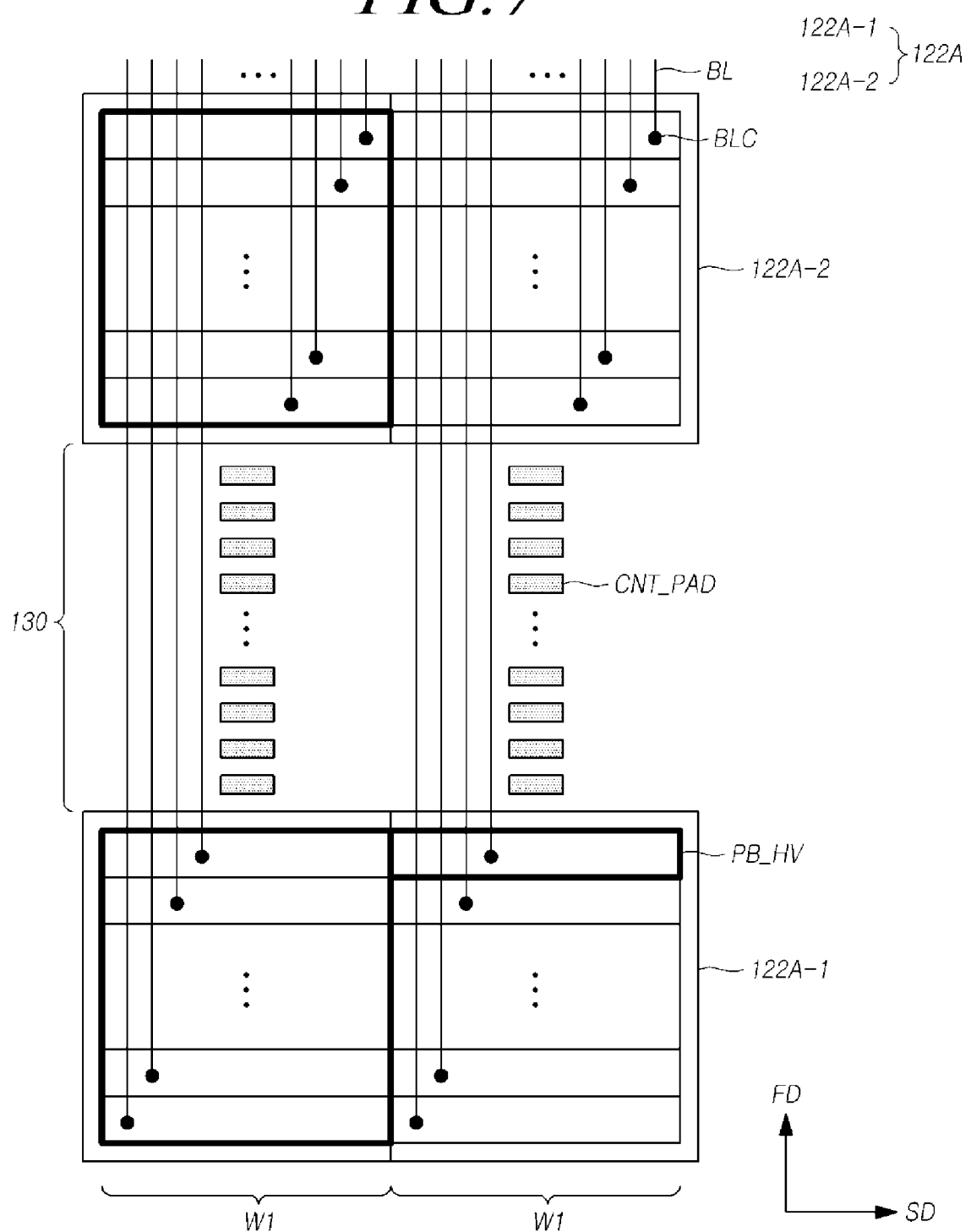
FIG. 7 is a diagram illustrating a layout of bit lines and an internal layout of the contact pad unit in FIG. 6.

FIG. 7 is a diagram illustrating a layout of bit lines and an internal layout of the contact pad unit in FIG. 6.

Referring to FIG. 7, each of the page buffer high-voltage elements PB_HV may be coupled to a corresponding bit line BL through a bit line contact BLC. For example, bit line contacts BLC may be disposed in a diagonal direction within each column of the page buffer high-voltage circuit 122A. In other words, in each column of the page buffer high-voltage circuit 122A, the bit line contacts BLC may be disposed at positions that consecutively incremented in the second direction SD as the bit line contacts BLC are incremented upward in the first direction FD.

The contact pad unit 130 may include a plurality of contact pads CNT_PAD. The contact pads CNT_PAD may be disposed in a bit line layer (M2 of FIG. 3). The contact pads CNT_PAD that are coupled to the page buffer high-voltage elements PB_HV disposed in a column may be arranged in a direction different from an arrangement direction of the bit lines BL. For example, the contact pads CNT_PAD that are coupled to the page buffer high-voltage elements PB_HV may be arranged in the first direction FD, which is the extending direction of the bit lines BL. Such arrangement of the contact pads CNT_PAD enables a larger width of the contact pad CNT_PAD, as compared to the pitch of the bit lines BL, in the second direction SD. For example, the width of the contact pad CNT_PAD in the second direction SD may be two times larger than the pitch of the bit lines BL.

Figure 8:
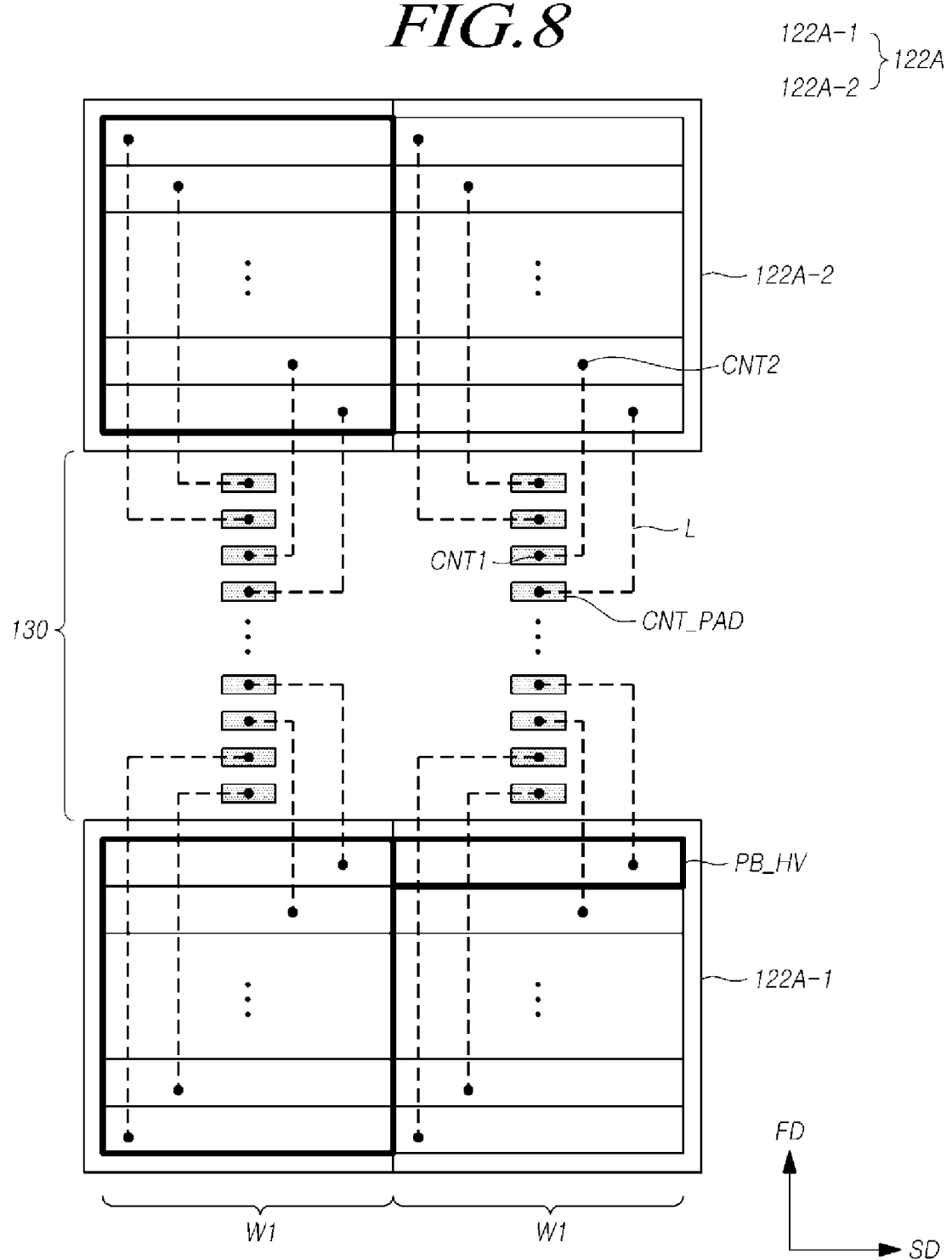
FIG. 8 is a diagram illustrating a layout of coupling lines in FIG. 6.

FIG. 8 is a diagram illustrating a layout of coupling lines in FIG. 6.

Referring to FIG. 8, in an embodiment, page buffer high-voltage elements PB_HV may be coupled to corresponding contact pads CNT_PAD using different coupling lines L. Namely, one coupling line L may be used to couple one page buffer high-voltage element PB_HV and one corresponding contact pad CNT_PAD. The coupling lines L may be disposed in a different layer, in the vertical direction, from the bit lines BL (see FIG. 7). For example, the coupling lines L may be disposed in a wiring layer (M1 of FIG. 3), which is between the bit line layer (M2 of FIG. 3) and the memory cell array (110A of FIG. 3).

Each coupling line L may be coupled to the contact pad CNT_PAD through a contact CNT1, and may be coupled to the page buffer high-voltage element PB_HV through a contact CNT2. As described above with reference to FIG. 6, the page buffer high-voltage circuit 122A is divided into the first page buffer high-voltage element group 122A-1 and the second page buffer high-voltage element group 122A-2 which are disposed on respective sides, in the first direction FD, of the contact pad unit 130. Consequently, coupling lines L that are coupled to the page buffer high-voltage elements PB_HV of the first page buffer high-voltage element group 122A-1 may be disposed on one side of the contact pad unit 130, and coupling lines L that are coupled to the page buffer high-voltage elements PB_HV of the second page buffer high-voltage element group 122A-2 may be disposed on the other side of the contact pad unit 130. Thus, the same number of coupling lines L and the page buffer high-voltage elements PB_HV of the first page buffer high-voltage element group 122A-1 may be provided on one side of the contact pad unit 130, and the same number of coupling lines L and the page buffer high-voltage elements PB_HV of the second page buffer high-voltage element group 122A-2 may be provided on the other side of the contact pad unit 130.

The number of page buffer high-voltage elements PB_HV included in each of the first page buffer high-voltage element group 122A-1 and the second page buffer high-voltage element group 122A-2 may be half of the number of the bit lines BL (see FIG. 7), which are arranged in the second direction SD. As a result, for each of the first page buffer high-voltage element group 122A-1 and the second page buffer high-voltage element group 122A-2, the number of the coupling lines L arranged in the second direction SD may be half of the number of the bit lines BL arranged in the second direction SD. Therefore, it is possible to increase the spacing between adjacent coupling lines L. As an example, the space between adjacent coupling lines L may be twice as large as the spacing between adjacent bit lines BL. By increasing the spacing between coupling lines, it is possible to suppress unnecessary interference between adjacent coupling lines L due to coupling capacitance, which contributes to improving the reliability of the semiconductor memory devices.

Figure 9:
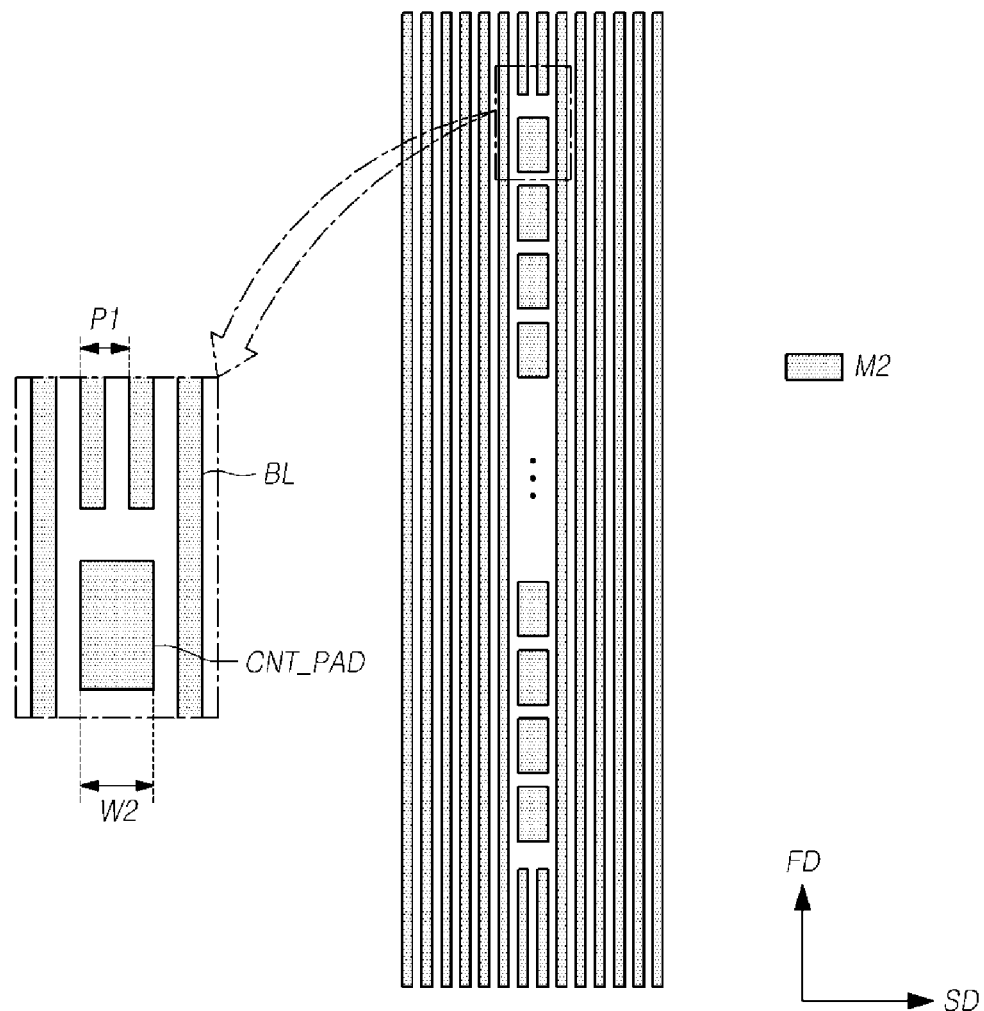
FIG. 9 is a top view illustrating a layout of a bit line layer of FIG. 7.

FIG. 9 is a view illustrating a layout of a bit line layer of FIG. 7.

Referring to FIG. 9, in a bit line layer M2, the contact pads CNT_PAD may be arranged in a direction intersecting with the arrangement direction of the bit lines BL. The bit lines BL may be arranged in the second direction SD, and the contact pads CNT_PAD may be arranged in the first direction FD intersecting with the second direction SD.

Because the arrangement direction of the contact pads CNT_PAD is different from the arrangement direction of the bit lines BL, the width of the contact pads CNT_PAD is not directly influenced by the pitch of the bit lines BL. Thus, the width of the contact pad CNT_PAD in the second direction SD may be larger than the pitch of the bit lines BL. For example, if the pitch of the bit lines BL has a first size P1, then the width of the contact pad CNT_PAD may have a second size W2, which is larger than the first size P1.

Figure 10:
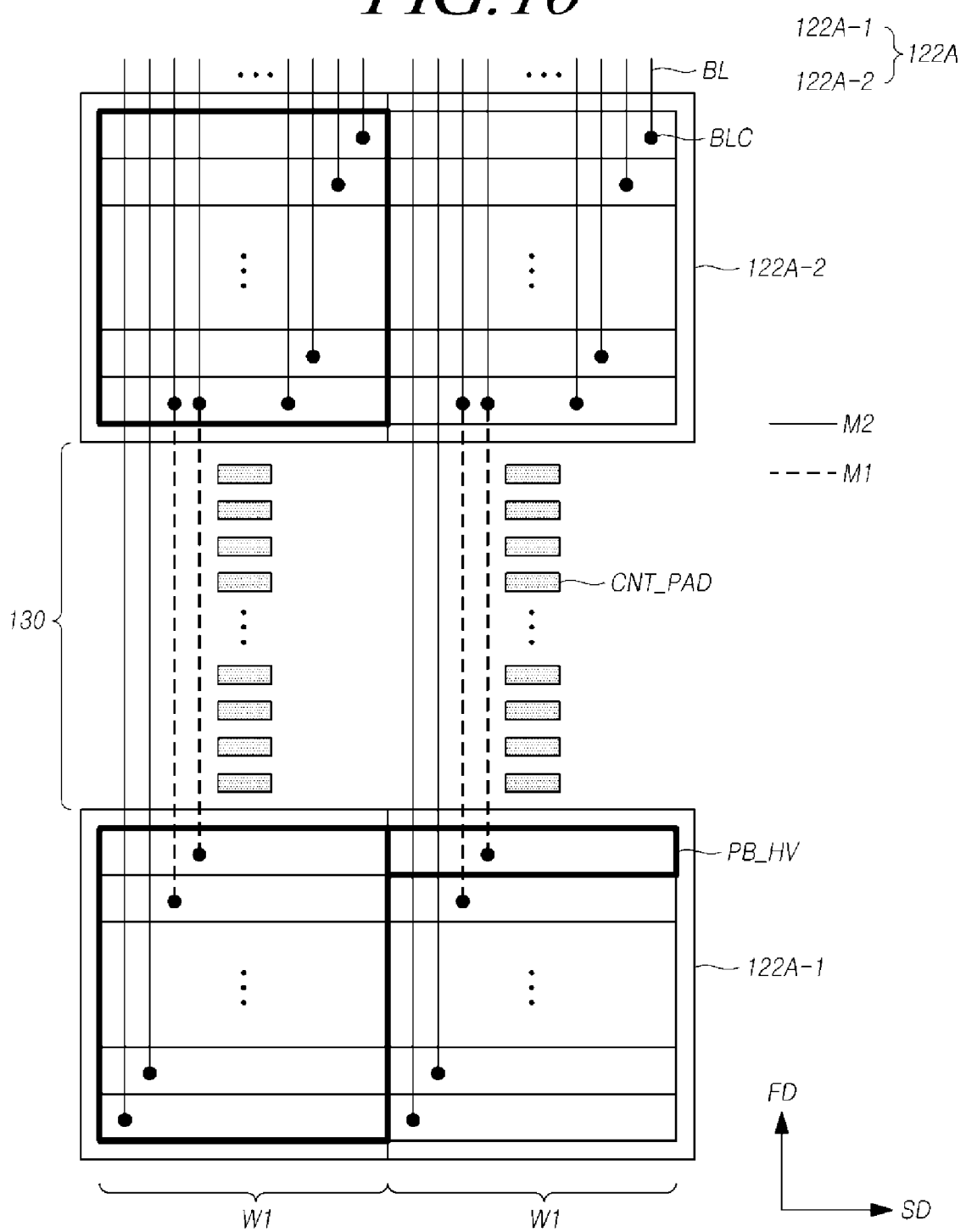
FIG. 10 is a diagram illustrating another layout of bit lines in FIG. 6.

FIG. 10 is a top view illustrating another layout of bit lines in FIG. 6.

In an embodiment, as the spacing between the bit lines BL narrows due to an increase in the degree of integration in a semiconductor memory device, the spacing between the contact pad CNT_PAD and the adjacent bit line BL is also narrowed. In this situation, a failure is highly likely to occur, in which a contact (CNT1 of FIG. 3) coupled to the contact pad CNT_PAD is shorted with the adjacent bit line BL. In order to prevent a short circuit between the contact (CNT1 of FIG. 3) and the adjacent bit line BL, a portion of the bit line BL, which is adjacent to the contact pad CNT_PAD, may be disposed in another layer, and not disposed in the bit line layer M2. For example, the portion of the bit line BL, which is adjacent to the contact pad CNT_PAD, may be disposed in the wiring layer M1, which is also used for the coupling lines L (see FIG. 8).

As described above with reference to FIG. 8, the number of coupling lines L arranged in the second direction SD is less than the number of bit lines BL arranged in the second direction SD. Unlike the crowded bit line layer M2, in which it may be difficult to dispose an additional wiring line because of tight margins, the wiring layer M1 has a more generous margin that accommodates a process margin for additional lines. Thus, even when the portion of the bit line BL, which is adjacent to the contact pad CNT_PAD, is disposed in the wiring layer M1, the process margin may be sufficient.

Figure 11:
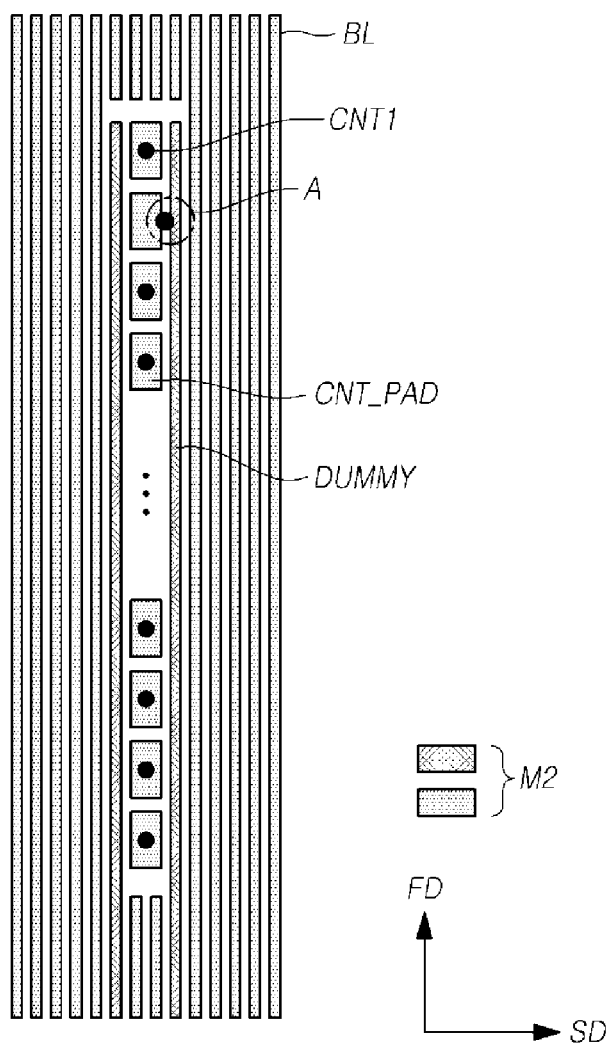
FIG. 11 is a top view illustrating a layout of a bit line layer of FIG. 10.

FIG. 11 is a top view illustrating a layout of a bit line layer of FIG. 10.

Referring to FIG. 11, in an embodiment, bit lines BL, dummy lines DUMMY and contact pads CNT_PAD may be disposed in the bit line layer M2. At least one dummy line DUMMY may be disposed between the contact pads CNT_PAD and the bit line BL adjacent to the contact pads CNT_PAD. The bit lines BL may be spaced apart from an adjacent contact pad CNT_PAD with the dummy line DUMMY interposed therebetween. The dummy line DUMMY may correspond to a dummy pattern that does not function electrically and has no influence on the operation of the semiconductor memory device. In order for uniformity in pattern density, the dummy lines DUMMY may be configured to have the same width and the same pitch as the bit lines BL. Each dummy line DUMMY may be disposed on the same line as one of the bit lines BL. The dummy line DUMMY and the bit line BL that are disposed on the same line may be separated from each other by a cutting process.

In comparison to embodiments of the disclosure, when a bit line and a contact pad are disposed adjacent to each other, a contact is highly likely to be simultaneously coupled to the contact pad and the adjacent bit line. This results in failures when a bit line coupled to a contact pad is electrically shorted with an adjacent bit line.

As illustrated in a part A of FIG. 11, a dummy line DUMMY is disposed between the contact pad CNT_PAD and the adjacent bit line BL. In this case, the contact CNT1 is highly likely to be simultaneously coupled to the contact pad CNT_PAD and the dummy line DUMMY. However, because the dummy line DUMMY has no influence on the operation of the semiconductor memory device, no failure occurs even when the contact CNT1 is coupled to the dummy line DUMMY.

Figure 12:
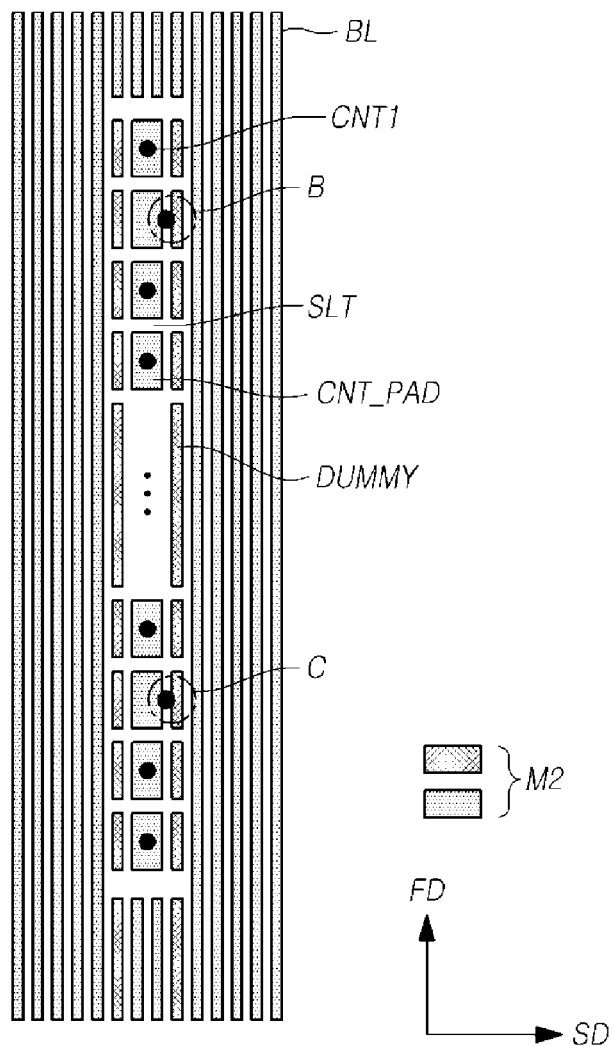
FIG. 12 is a top view illustrating another layout of a bit line layer of FIG. 10.

FIG. 12 is a top view illustrating another layout of a bit line layer of FIG. 10.

Referring to FIG. 12, in an embodiment, each dummy line DUMMY may be divided into a plurality of segments that correspond to the contact pads CNT_PAD. The contact pads CNT_PAD are separated by slits SLT that extend in the second direction SD, which also separates the dummy line DUMMY segments.

Where the dummy line DUMMY is disposed between the contact pads CNT_PAD and the adjacent bit line BL, two or more contacts CNT1 are likely to be coupled to the dummy line DUMMY. For example, if the dummy line DUMMY is configured as a continuous line that extends along the plurality of contact pads CNT_PAD, then a failure may be caused in which more than one contact CNT1 are shorted with each other through the dummy line DUMMY. In FIG. 12, however, the dummy line DUMMY is divided into the plurality of segments in correspondence to the contact pads CNT_PAD, so that even when two or more contacts CNT1 are coupled to the dummy line DUMMY, the contacts CNT1 are not shorted with each other. An example is illustrated in a part B and a part C of FIG. 12.

Figure 13:
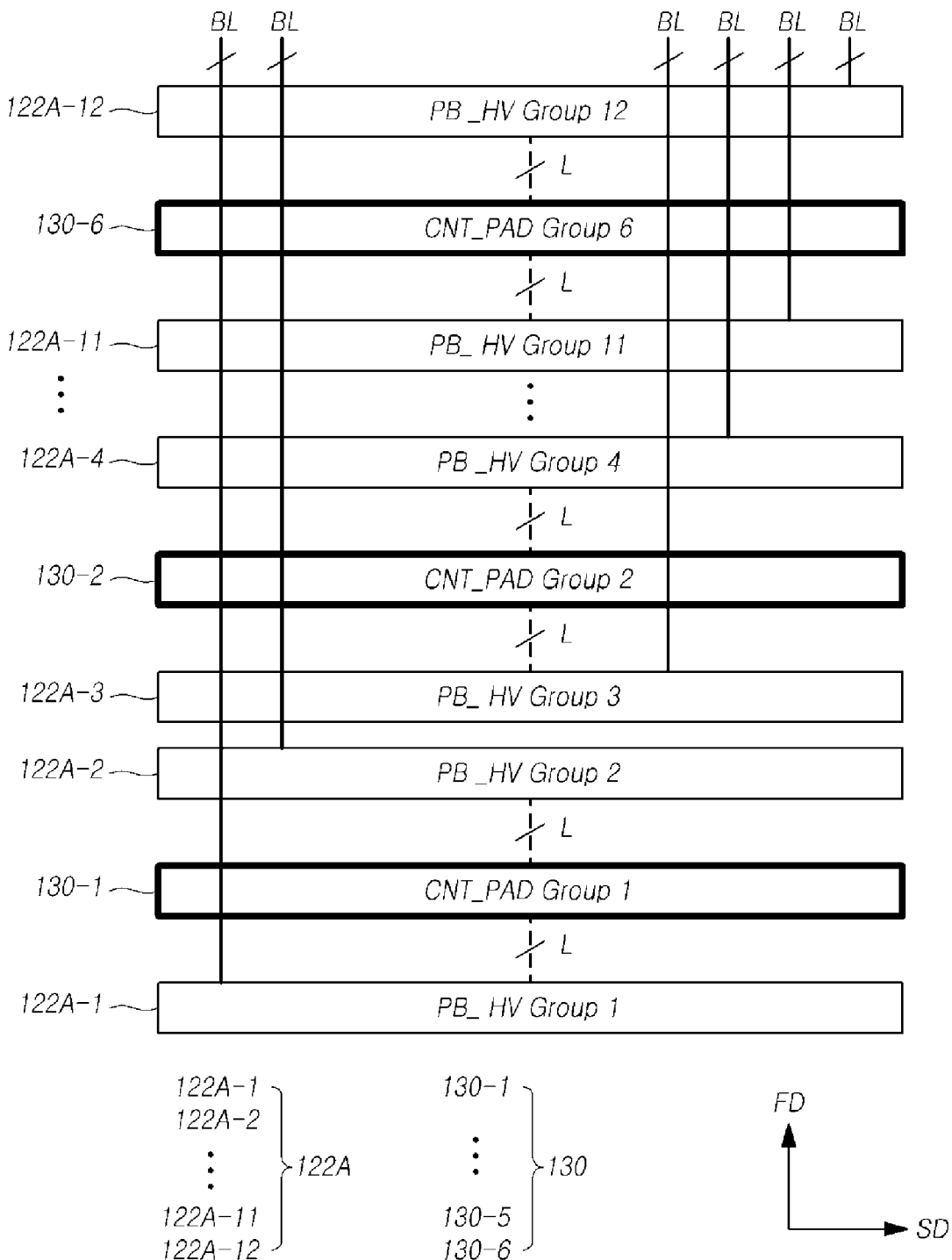
FIG. 13 is a block diagram illustrating another layout of a page buffer high-voltage circuit and a contact pad unit in accordance with an embodiment of the disclosure.

FIG. 13 is a block diagram illustrating another layout of a page buffer high-voltage circuit and a contact pad unit in accordance with an embodiment of the disclosure.

Referring to FIG. 13, a contact pad unit 130 may be divided into first to sixth contact pad groups 130-1 to 130-6. The first to sixth contact pad groups 130-1 to 130-6 may be arranged in the first direction FD, which is also the extending direction of bit lines BL. The page buffer high-voltage circuit 122A may be divided into first to twelfth page buffer high-voltage element groups 122A-1 to 122A-12. When viewed from the top, the first page buffer high-voltage element group 122A-1 and the second page buffer high-voltage element group 122A-2 may be disposed on both sides, respectively, of the first contact pad group 130-1 in the first direction FD. The remaining ten (10) page buffer high-voltage element groups 122A-3 to 122A-12 may be divided into four pairs, and in a similar manner each pair of the page buffer high-voltage element groups may be disposed on both sides, respectively, of a corresponding contact pad group, from among the five contact pad groups 130-2 to 130-6, in the first direction FD.

In FIG. 13, the contact pad groups 130-1 to 130-6 may be spatially divided from one another, and the contact pad unit 130 may be defined as being divided into a plurality of contact pad regions. In the same manner, the page buffer high-voltage element groups 122A-1 to 122A-12 may be spatially divided from one another such that the page buffer high-voltage circuit 122A may be defined as being divided into a plurality of page buffer high-voltage regions. In this way, the contact pad unit 130 may be divided into the plurality of contact pad groups 130-1 to 130-6, the page buffer high-voltage circuit 122A may be divided into the page buffer high-voltage element groups 122A-1 to 122A-12. The number of page buffer high-voltage element groups 122A-1 to 122A-12 is twice the number of the contact pad groups 130-1 to 130-6 because each contact pad group corresponds to two page buffer high-voltage element groups, which are paired with each other and disposed on opposite sides of the contact pad group in the first direction FD.

Although, as described herein, the contact pad unit 130 is divided into six contact pad groups 130-1 to 130-6 and the page buffer high-voltage circuit 122A is divided into 12 page buffer high-voltage element groups 122A-1 to 122A-12, embodiments contemplated by the present disclosure are not limited thereto. Embodiments of the disclosure include all instances in which the contact pad unit 130 is constituted by one contact pad group or is divided into at least two contact pad groups and the page buffer high-voltage circuit 122A is divided into page buffer high-voltage element groups whose number is two times the number of contact pad groups.

The first to twelfth page buffer high-voltage element groups 122A-1 to 122A-12 may be coupled to a plurality of bit lines BL, and thereby, may obtain information on a state of a memory cell array through the bit lines BL. The first to twelfth page buffer high-voltage element groups 122A-1 to 122A-12 may be coupled to the contact pad unit 130 through a plurality of coupling lines L.

Figure 14:
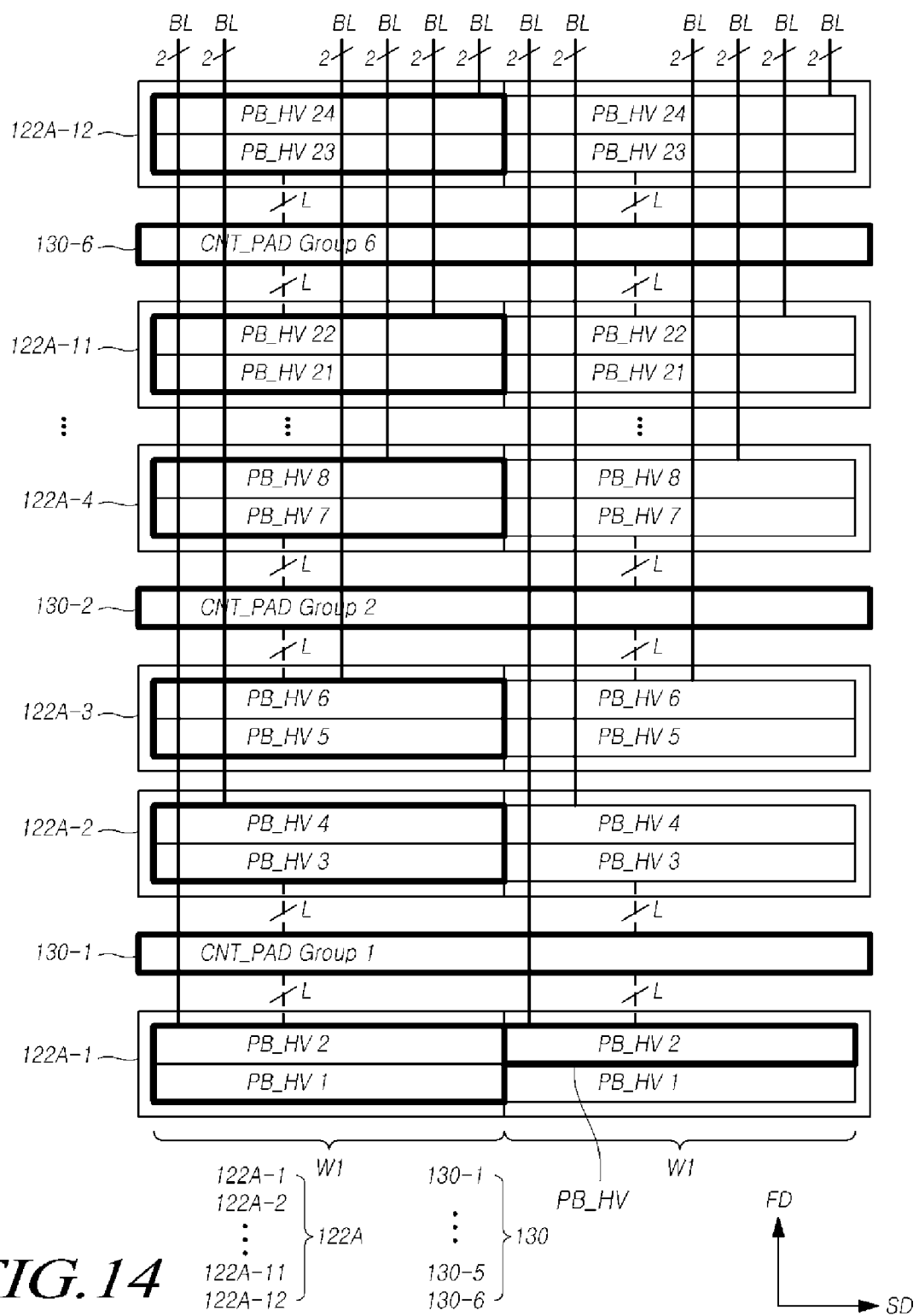
FIG. 14 is a diagram illustrating an internal layout of page buffer high-voltage element groups of FIG. 13.

FIG. 14 is a diagram illustrating an internal layout of page buffer high-voltage element groups of FIG. 13.

Referring to FIG. 14, each of the page buffer high-voltage element groups 122A-1 to 122A-12 may include a plurality of page buffer high-voltage elements PB_HV, which are arranged in the form of a matrix in the first direction FD and the second direction SD. The number of rows of each of the page buffer high-voltage element groups 122A-1 to 122A-12 may be one-twelfth ($\frac{1}{12}$) of the total number of rows of the page buffer high-voltage circuit 122A. For example, if the number of rows of the page buffer high-voltage circuit 122A is 24, then the number of rows of each of the page buffer high-voltage element groups 122A-1 to 122A-12 may be two.

The page buffer high-voltage elements PB_HV of the first page buffer high-voltage element group 122A-1 may be coupled in one-to-one correspondence to contact pads in the first contact pad group 130-1. To this end, coupling lines L, whose number is the same as the number of rows of the first page buffer high-voltage element group 122A-1, may be provided in each column of the first page buffer high-voltage element group 122A-1, and thereby, may be used to couple the page buffer high-voltage elements PB_HV of the first page buffer high-voltage element group 122A-1 and the contact pads of the first contact pad group 130-1. For example, if the number of rows of page buffer high-voltage elements PB_HV of the first page buffer high-voltage element group 122A-1 is two, then two coupling lines L may be provided within a page buffer high-voltage element width W1 on one side of the first contact pad group 130-1 common to the first page buffer high-voltage element group 122A-1.

The page buffer high-voltage elements PB_HV of the second page buffer high-voltage element group 122A-2 may be coupled in one-to-one correspondence to contact pads in the first contact pad group 130-1. To this end, coupling lines L, whose number is the same as the number of rows of the second page buffer high-voltage element group 122A-2, may be provided in each column of the second page buffer high-voltage element group 122A-2, and thereby, may be used to couple the page buffer high-voltage elements PB_HV of the second page buffer high-voltage element group 122A-2 and the contact pads of the first contact pad group 130-1. For example, if the number of rows of page buffer high-voltage elements PB_HV of the second page buffer high-voltage element group 122A-2 is two, then two coupling lines L may be provided within the page buffer high-voltage element width W1 on the other side of the first contact pad group 130-1 common to the second page buffer high-voltage element group 122A-2.

In a similar manner, two coupling lines L may be provided within the page buffer high-voltage element width W1 on each of one side and the other side of each of the remaining five contact pad groups 130-2 to 130-6.

Figure 15:
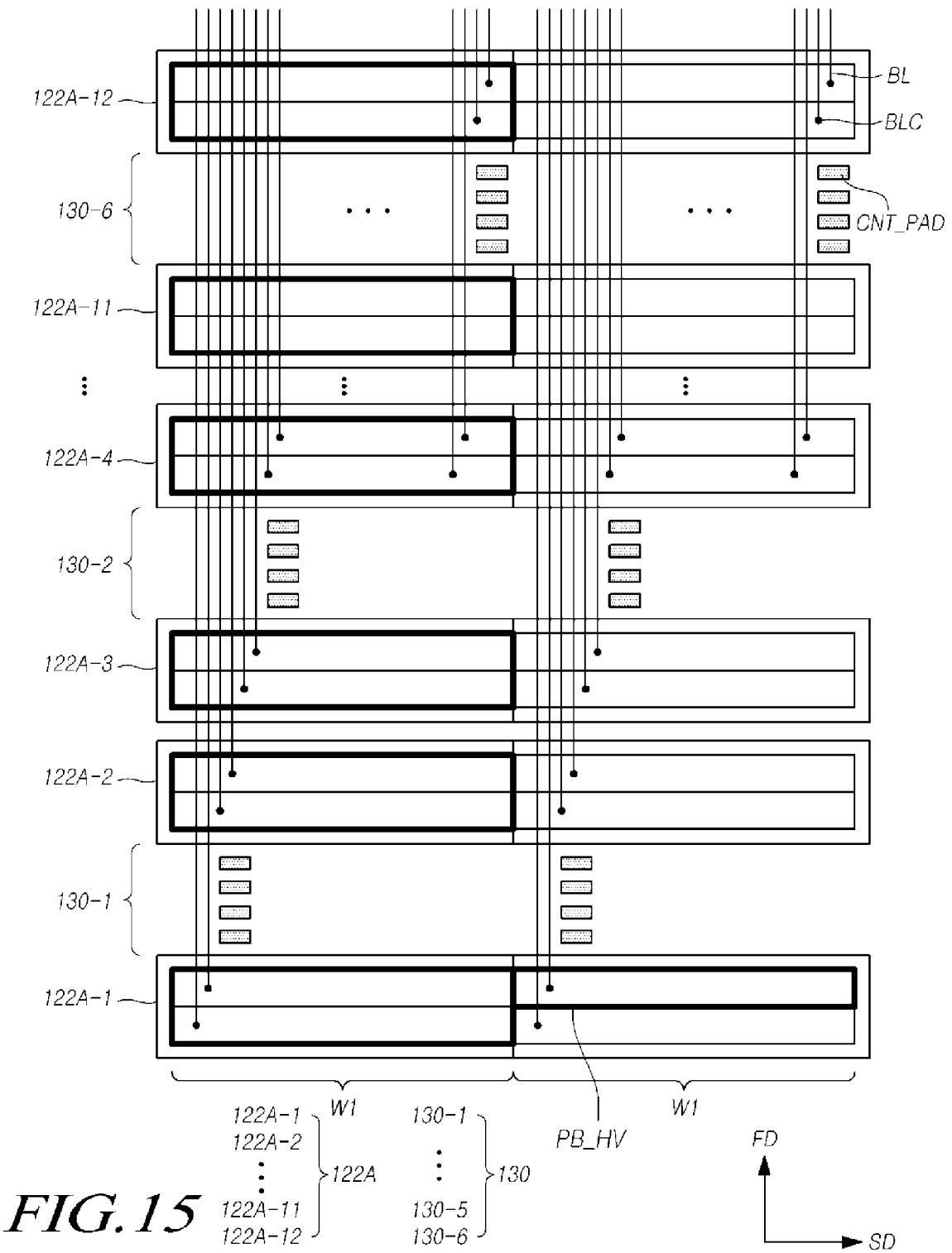
FIG. 15 is a diagram illustrating a layout of bit lines and an internal layout of the contact pad unit in FIG. 14.

FIG. 15 is a diagram illustrating a layout of bit lines and an internal layout of the contact pad unit in FIG. 14.

Referring to FIG. 15, each of the page buffer high-voltage elements PB_HV may be coupled to a corresponding bit line BL through a bit line contact BLC. For example, bit line contacts BLC may be disposed in a diagonal direction within each column of the page buffer high-voltage circuit 122A. In other words, in each column of the page buffer high-voltage circuit 122A, the bit line contacts BLC may be disposed at positions that consecutively incremented in the second direction SD as the bit line contacts BLC are incremented upward in the first direction FD.

Each of the contact pad groups 130-1 to 130-6 may include a plurality of contact pads CNT_PAD. Contact pads CNT_PAD that are coupled to the page buffer high-voltage elements PB_HV of the first page buffer high-voltage element group 122A-1, and contact pads CNT_PAD that are coupled to the page buffer high-voltage elements PB_HV of the second page buffer high-voltage element group 122A-2, may be disposed in the first contact pad group 130-1. Contact pads CNT_PAD that are coupled to page buffer high-voltage elements that constitute a pair of corresponding page buffer high-voltage element groups may also be disposed in each of the remaining five contact pad groups 130-2 to 130-6.

In each column of the page buffer high-voltage circuit 122A, the number of rows of page buffer high-voltage element groups in a pair of corresponding page buffer high-voltage element groups is the same as the number of corresponding contact pads CNT_PAD. Such corresponding contact pads CNT_PAD may be disposed in each of the contact pad groups 130-1 to 130-6. For example, in one column of the page buffer high-voltage circuit 122A, four contact pads CNT_PAD corresponding to the sum of the number of rows (two) of the first page buffer high-voltage element group 122A-1 and the number of rows (two) of the second page buffer high-voltage element group 122A-2 may be disposed in the first contact pad group 130-1.

In each column of the page buffer high-voltage circuit 122A, the contact pads CNT_PAD that are disposed in each of the contact pad groups 130-1 to 130-6 may be arranged in a line in a direction intersecting with the arrangement direction of the bit lines BL. For example, in a first column of the page buffer high-voltage circuit 122A, the contact pads CNT_PAD of the first contact pad group 130-1 may be arranged in a line in the first direction FD, which is also the extending direction of the bit lines BL.

As contact pad groups are arranged upward in the first direction FD, a column of contact pads CNT_PAD included in a contact pad group may be disposed at positions that are consecutively farther away in the second direction SD. While this illustration describes columns of the contact pads CNT_PAD included in different contact pad groups as offset from each other in the second direction SD, the present disclosure is not limited thereto. In other embodiments, as an example, the columns of the contact pads CNT_PAD included in different contact pad groups may be disposed on the same line.

Figure 16:
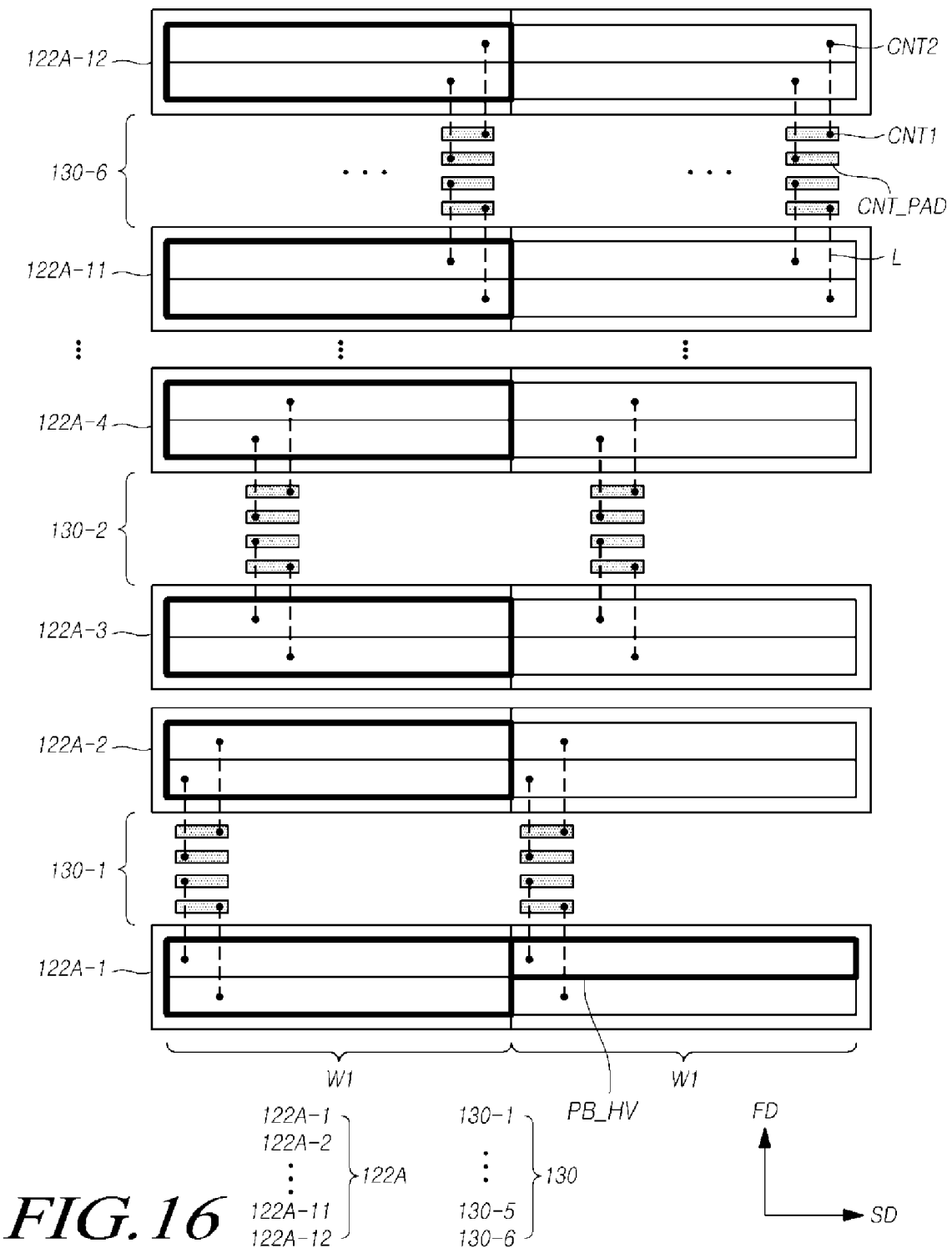
FIG. 16 is a diagram illustrating a layout of coupling lines in FIG. 14.

FIG. 16 is a diagram illustrating a layout of coupling lines in FIG. 14.

Referring to FIG. 16, the page buffer high-voltage elements PB_HV may be coupled to corresponding contact pads CNT_PAD using different coupling lines L. Namely, one coupling line L may be used to couple one page buffer high-voltage element PB_HV and one corresponding contact pad CNT_PAD. The coupling lines L may be disposed in a different layer, in the vertical direction, from the bit lines BL (see FIG. 15). For example, the coupling lines L may be configured using a wiring layer (M1 of FIG. 3) that is disposed between the bit line layer (M2 of FIG. 3) and the memory cell array (110A of FIG. 3).

Each coupling line L may be coupled to the contact pad CNT_PAD through a contact CNT1, and may be coupled to the page buffer high-voltage element PB_HV through a contact CNT2. As described above with reference to FIG. 13, the page buffer high-voltage circuit 122A is divided into the page buffer high-voltage element groups 122A-1 to 122A-12, whose number is two times the number of contact pad groups 130-1 to 130-6. The page buffer high-voltage element groups 122A-1 to 122A-12 are divided into six pairs of two page buffer high-voltage element groups. Each pair corresponds to one contact pad group, and the page buffer high-voltage element groups are disposed on both sides, respectively, of the corresponding contact pad group. Each of the pair of page buffer high-voltage element groups has page buffer high-voltage elements coupled to the contact pad group through coupling lines L, which are respectively disposed on both sides, respectively, of the corresponding contact pad group. As a result, coupling lines L number the same as the number of the page buffer high-voltage elements PB_HV of a first adjacent page buffer high-voltage element group on one side of each of the contact pad groups 130-1 to 130-6, and coupling lines L number the same as the number of the page buffer high-voltage elements PB_HV of the second adjacent page buffer high-voltage element group on the other side of each of the contact pad groups 130-1 to 130-6.

As an example, if the contact pad unit 130 is divided into six contact pad groups, then the number of coupling lines L that are arranged in the second direction SD is one twelfth ($1/12$) of the total number of bit lines BL that are arranged in the second direction SD. That is to say, the number of coupling lines L that are arranged in the second direction SD may correspond to a value obtained by dividing the number (M) of bit lines BL by two times (2N) the number of contact pad groups.

In this way, by dividing the contact pad unit 130 into a plurality of contact pad groups, the number of coupling lines L that are arranged in the second direction SD may be further reduced. Therefore, because the spacing between adjacent coupling lines L may be increased, it is possible to further suppress unnecessary interference between adjacent coupling lines L due to coupling capacitance.

Figure 17:
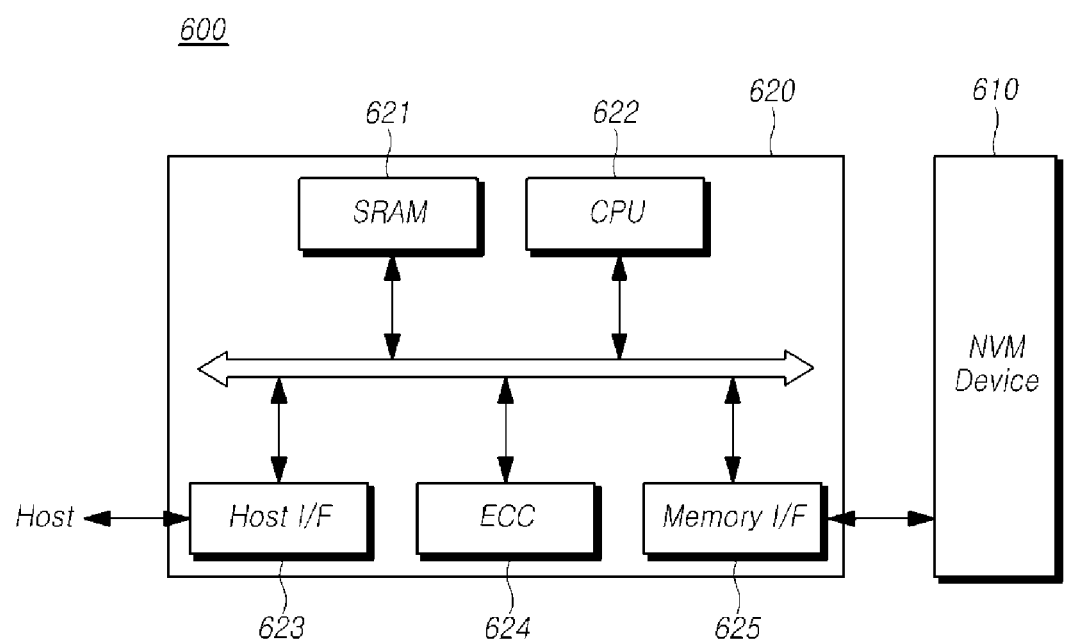
FIG. 17 is a block diagram schematically illustrating a memory system including a semiconductor memory device in accordance with embodiments of the disclosure.

FIG. 17 is a block diagram schematically illustrating a memory system including a semiconductor memory device in accordance with embodiments of the disclosure.

Referring to FIG. 17, a memory system 600 in accordance with an embodiment may include a nonvolatile memory device 610 and a memory controller 620.

The nonvolatile memory device (NVM Device) 610 may be constituted by the semiconductor memory device described above and may operate in the manner described above. The memory controller 620 may be configured to control the nonvolatile memory device 610. By the combination of the nonvolatile memory device 610 and the memory controller 620, a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 18:
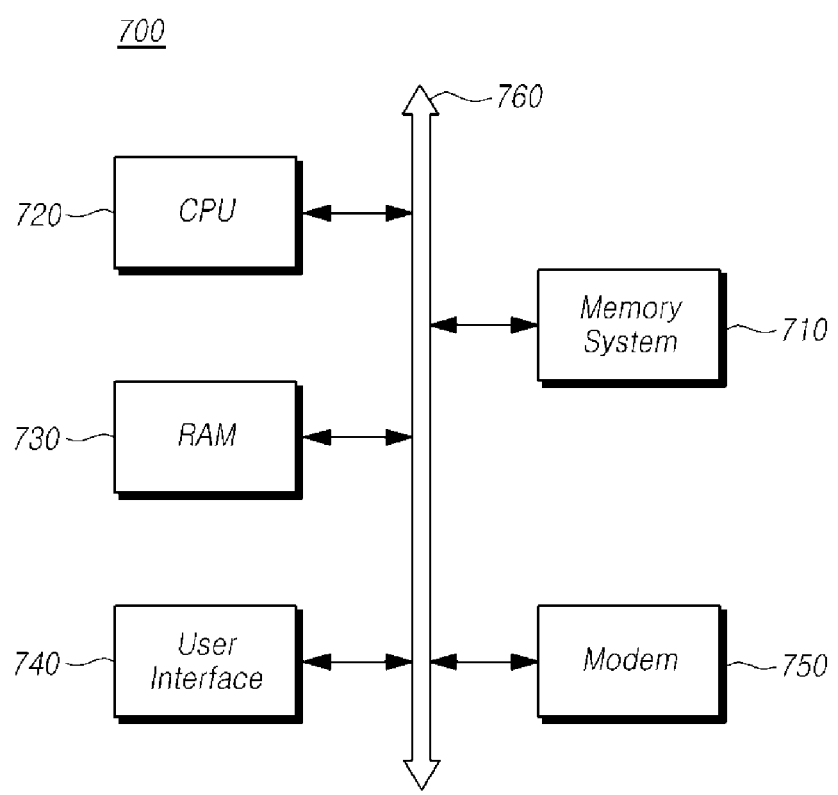
FIG. 18 is a block diagram schematically illustrating a computing system including a semiconductor memory device in accordance with embodiments of the disclosure.

FIG. 18 is a block diagram schematically a computing system including a semiconductor memory device in accordance with embodiments of the disclosure.

Referring to FIG. 18, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
    a plurality of bit lines extending in a first direction, and arranged in a second direction intersecting with the first direction;
    a page buffer high-voltage circuit divided into a plurality of page buffer high-voltage regions arranged in the first direction, each of the plurality of page buffer high-voltage regions including a plurality of page buffer high-voltage elements, each page buffer high-voltage element coupled to one of the plurality of bit lines; and
    a contact pad unit including a plurality of contact pads, each contact pad coupled to one of the plurality of page buffer high-voltage elements,
    wherein the contact pad unit is arranged, in the first direction, between two of the plurality of page buffer high-voltage regions.

2. The semiconductor memory device according to claim 1, further comprising:
    a plurality of bonding pads disposed on one surface of the semiconductor memory device; and
    a plurality of contacts coupling the plurality of bonding pads to the plurality of contact pads, respectively,
    wherein the contact pad unit is disposed in a bit line layer with the plurality of bit lines.

3. The semiconductor memory device according to claim 1,
    wherein the contact pad unit is divided into at least two contact pad regions including a plurality of contact pads, and
    wherein each of the at least two contact pad regions is arranged, in the first direction, between different page buffer high-voltage regions from among the plurality of page buffer high-voltage regions.

4. The semiconductor memory device according to claim 3,
    wherein the number of page buffer high-voltage regions in the plurality of page buffer high-voltage regions is twice the number of contact pad regions in the at least two contact pad regions, and
    wherein each of the at least two contact pad regions is disposed between a corresponding pair of page buffer high-voltage regions from among the plurality of page buffer high-voltage regions.

5. The semiconductor memory device according to claim 4, wherein each of the plurality of page buffer high-voltage elements of a corresponding pair of page buffer high-voltage regions is coupled to one of the plurality of contact pads of the corresponding contact pad region.

6. The semiconductor memory device according to claim 3, wherein the plurality of contact pads is arranged in a direction intersecting with the second direction.

7. The semiconductor memory device according to claim 6, wherein the plurality of contact pads in each of the at least two contact pad regions is arranged in the first direction, and the plurality of contact pads in one of the at least two contact pad regions is offset in the second direction from the plurality of contact pads in another of the at least two contact pad regions.

8. The semiconductor memory device according to claim 1, wherein each of the plurality of contact pads is electrically coupled to a corresponding one of the plurality of page buffer high-voltage elements through a corresponding one of a plurality of coupling lines.

9. The semiconductor memory device according to claim 8, wherein the plurality of coupling lines are disposed in a wiring layer, and wherein the wiring layer is disposed, in a vertical direction perpendicular to the first direction and the second direction, between a layer including the plurality of bit lines and a memory cell array.

10. The semiconductor memory device according to claim 8, wherein the plurality of coupling lines are arranged in the second direction, and the number of coupling lines is less than the number of bit lines in the plurality of bit lines.

11. The semiconductor memory device according to claim 1, wherein the plurality of bit lines is disposed in a bit line layer with a dummy line that is disposed between one of the plurality of contact pads and an adjacent one of the plurality of bit lines.

12. The semiconductor memory device according to claim 11, wherein the dummy line is divided into a plurality of segments that is coextensive in the first direction with the plurality of contact pads.

13. A semiconductor memory device of a memory chip in a semiconductor memory device comprising:
   a plurality of bit lines;
   a contact pad unit including a plurality of contact pads; and
   a page buffer high-voltage circuit including a plurality of page buffer high-voltage elements that are coupled between the plurality of bit lines and the plurality of contact pads,
   wherein the plurality of contact pads is arranged in a direction intersecting with an arrangement direction of the plurality of bit lines, and a width of one of the plurality of contact pads is larger than a pitch of the plurality of bit lines in the arrangement direction of the bit lines, and
   wherein the contact pad unit and the plurality of bit lines are disposed in a bit line layer,
   wherein the pitch of the bit lines is a sum of a size of a width of one of the plurality of bit lines in the arrangement direction of the plurality of bit lines and a size of a spacing between adjacent two bit lines in the arrangement direction of the plurality of bit lines.

14. The semiconductor memory device according to claim 13, further comprising:
   a plurality of bonding pads disposed on one surface of the semiconductor memory device; and
   a plurality of contacts coupling the plurality of bonding pads to the plurality of contact pads, respectively.

15. The semiconductor memory device according to claim 13, wherein the page buffer high-voltage circuit is divided into a plurality of page buffer high-voltage regions, and two of the plurality of page buffer high-voltage regions are disposed on both sides, respectively, of the contact pad unit in an extending direction of the bit lines.

16. The semiconductor memory device according to claim 15,
   wherein the contact pad unit is divided into at least two contact pad regions, and
   wherein the two of the plurality of page buffer high-voltage regions constitutes a pair of page buffer high-voltage regions corresponding to the contact pad region therebetween.

17. The semiconductor memory device according to claim 16,
   wherein the number of page buffer high-voltage regions in the page buffer high-voltage circuit is twice the number of the contact pad regions of the contact pad unit.

18. The semiconductor memory device according to claim 13, wherein each of the plurality of contact pads is electrically coupled to one of the plurality of page buffer high-voltage elements through a corresponding coupling line among a plurality of coupling lines,
   wherein the number bit lines in the plurality of bit lines is M and the number of the at least two contact pad regions is N, and the number of coupling lines is M/2N.

19. A semiconductor memory device comprising:
   a circuit chip and at least one memory chip that is stacked on the circuit chip,
   the memory chip comprising:
   a memory cell array;
   a plurality of bonding pads defined on one surface;
   a plurality of bit lines disposed in a bit line layer between the memory cell array and the plurality of bonding pads;
   a contact pad unit including a plurality of contact pads disposed in the bit line layer, and coupled to the plurality of bonding pads through a plurality of contacts, respectively; and
   a page buffer high-voltage circuit divided into a plurality of page buffer high-voltage regions each including a plurality of page buffer high-voltage elements that are coupled between the plurality of bit lines and the plurality of contact pads,
   wherein at least two of the plurality of page buffer high-voltage regions are disposed on both sides, respectively, of the contact pad unit in an extending direction of the bit lines.

20. The semiconductor memory device according to claim 19, wherein the plurality of contact pads are arranged in a direction intersecting with an arrangement direction of the plurality of bit lines, and a width of one of the plurality of contact pads is larger than a pitch, in the arrangement direction, of the plurality of bit lines,
   wherein the pitch is a sum of a size of a width of one of the plurality of bit lines in the arrangement direction of the plurality of bit lines and a size of a spacing between adjacent two bit lines in the arrangement direction of the plurality of bit lines.

* * * * *